United States Patent
Kuo et al.

(10) Patent No.: US 7,597,487 B2
(45) Date of Patent: Oct. 6, 2009

(54) OPTICAL COMMUNICATION DEVICE

(75) Inventors: San-Ching Kuo, Taoyuan Hsien (TW); Chiung-Hung Wang, Taoyuan Hsien (TW); Chia-Wen Lin, Taoyuan Hsien (TW); Ming-Chia Wu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 11/971,736

(22) Filed: Jan. 9, 2008

(65) Prior Publication Data
US 2008/0232812 A1   Sep. 25, 2008

(30) Foreign Application Priority Data
Mar. 21, 2007   (TW) .............................. 96109675 A

(51) Int. Cl.
*G02B 6/36*   (2006.01)
*H04B 10/00*  (2006.01)
*H05K 5/04*   (2006.01)

(52) U.S. Cl. ........................ 385/92; 385/88; 385/89; 398/135; 361/753

(58) Field of Classification Search .................. 385/14, 385/88, 89, 92, 93, 94, 129, 130, 131, 132; 398/135, 136, 138, 139; 439/577; 361/753
See application file for complete search history.

(56) References Cited

U.S. PATENT DOCUMENTS

| | | | |
|---|---|---|---|
| 6,201,704 B1 * | 3/2001 | Poplawski et al. | 361/753 |
| 6,893,168 B2 * | 5/2005 | Huang et al. | 385/92 |
| 7,440,865 B1 * | 10/2008 | Hofmeister et al. | 702/120 |
| 2002/0131220 A1 * | 9/2002 | Li | 361/56 |
| 2003/0072539 A1 * | 4/2003 | Huang et al. | 385/92 |
| 2003/0072540 A1 * | 4/2003 | Huang | 385/92 |
| 2008/0232812 A1 * | 9/2008 | Kuo et al. | 398/135 |

\* cited by examiner

*Primary Examiner*—Brian M Healy
(74) *Attorney, Agent, or Firm*—Birch, Stewart, Kolasch & Birch, LLP

(57) ABSTRACT

An optical communication device includes a top cover, a bottom cover, a circuit board and an electrostatic discharge element. The bottom cover is disposed opposite to the top cover, and an accommodating space is formed between the top and bottom covers. The circuit board is disposed in the accommodating space. The electrostatic discharge element is disposed on the circuit board and electrically connected to the circuit board.

18 Claims, 3 Drawing Sheets

OPTICAL COMMUNICATION DEVICE

CROSS REFERENCE TO RELATED APPLICATIONS

This Non-provisional application claims priority under 35 U.S.C. §119(a) on Patent Application No(s). 096109675 filed in Taiwan, Republic of China on Mar. 21, 2007, the entire contents of which are hereby incorporated by reference.

BACKGROUND OF THE INVENTION

1. Field of Invention

The invention relates to an optical communication device and, in particular, to an optical communication device with an electrostatic discharge function.

2. Related Art

In recent years, electronic circuits are widely used in various kinds of apparatuses. As the electronic products need more high-frequency circuits and high-speed electronic devices with much powerful functions, the demand for protection of electrostatic discharge (ESD) becomes imperative. Electrostatic phenomena occur very often in natural environments, such as when clothes rub against each other or lightening occurs. Of course, such phenomena also occur to electronic products.

Take optical communication devices as an example. Electrostatic charges accumulate in human bodies, instrument, and storage equipment during the processes of manufacturing, production, assembly, testing, storage and transportation. Even the electronic devices themselves also accumulate electrostatic charges. When users are unaware of touching these objects, a discharge path forms for the electrostatic charges. If this happened, the electronic product or device can be damaged by the discharge.

Most electronic products or devices may experience electrical overstress (EOS). Such phenomena will cause permanent damages to the internal circuits or semiconductor devices in the electronic products or devices, also affecting operations of the integrated circuit (IC) thereof. Therefore, the reliability of the electronic products decreases.

Therefore, it is an important subject to provide an optical communication device having an electrostatic discharge path and the electrostatic discharge function.

SUMMARY OF THE INVENTION

In view of the foregoing, an object of the invention is to provide an optical communication device having an electrostatic discharge path and the electrostatic discharge function.

To achieve the above, the invention discloses an optical communication device including a cover body, a circuit board and an electrostatic discharge element. The cover body includes a top cover and a bottom cover, which are disposed opposite to each other and form an accommodating space therebetween. The circuit board is disposed in the accommodating space. The electrostatic discharge element is disposed on the circuit board and electrically connected to the circuit board.

According to the embodiment of the invention, the top cover has a plurality of first connecting portions disposed on an inner wall of the top cover and extending toward the accommodating space.

According to the embodiment of the invention, the bottom cover has an accommodating recess and a second connecting portion disposed on the inner wall of the bottom cover and extending toward the accommodating space. The first connecting portion and the second connecting portion are disposed opposite to each other.

According to the embodiment of the invention, the top cover and the bottom cover are connected by wedging or locking.

According to the embodiment of the invention, the optical communication device further includes an optical transceiver disposed on the accommodating recess and electrically connected to the circuit board.

According to the embodiment of the invention, the optical transceiver has a plurality of first pins electrically connected to the circuit board. The optical transceiver has a housing, which is made of a conductive material or an insulating material.

According to the embodiment of the invention, the optical transceiver includes a transmitter optical sub-assembly or a receiver optical sub-assembly.

According to the embodiment of the invention, the circuit board is disposed in the accommodating space and is located between the first connecting portion and the second connecting portion.

According to the embodiment of the invention, the circuit board has a ground portion and an electrical connecting portion electrically connected to the first connecting portion of the top cover.

According to the embodiment of the invention, the electrostatic discharge element has a first terminal electrically connected to the electrical connecting portion of the circuit board and a second terminal electrically connected to the ground portion of the circuit board. The electrostatic discharge element is an electrostatic discharge diode.

According to the embodiment of the invention, the optical transceiver includes a plurality of first pins electrically connected to the circuit board and a second pin electrically connected to one terminal of the electrostatic discharge element. The second pin is electrically connected to a housing of the optical transceiver.

According to the embodiment of the invention, the optical transceiver further includes a plurality of insulating layers surrounding the first pins and the second pin.

As mentioned above, in the optical communication device of the invention, the electrostatic discharge element is electrically connected to the circuit board and the top cover of the optical communication device so as to form an electrostatic discharge path through the top cover, the electrostatic discharge element and the circuit board. Alternatively, the electrostatic discharge element can be electrically connected to the optical transceiver and the circuit board, so that the optical transceiver can be in electrical contact with the bottom cover of the optical communication device. Therefore, the bottom cover, the optical transceiver, the electrostatic discharge element and the circuit board can also form an electrostatic discharge path. Therefore, the electrostatic discharge element can conduct the electrostatic charges to the circuit board, preventing them from directly discharging via the internal circuit or other electronic device of the optical communication device and its optical transceiver. This avoids damages to the optical communication device. The electrostatic discharge element enhances the electrostatic protection ability of the disclosed optical communication device and thus increases the reliability thereof.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Figure 1:
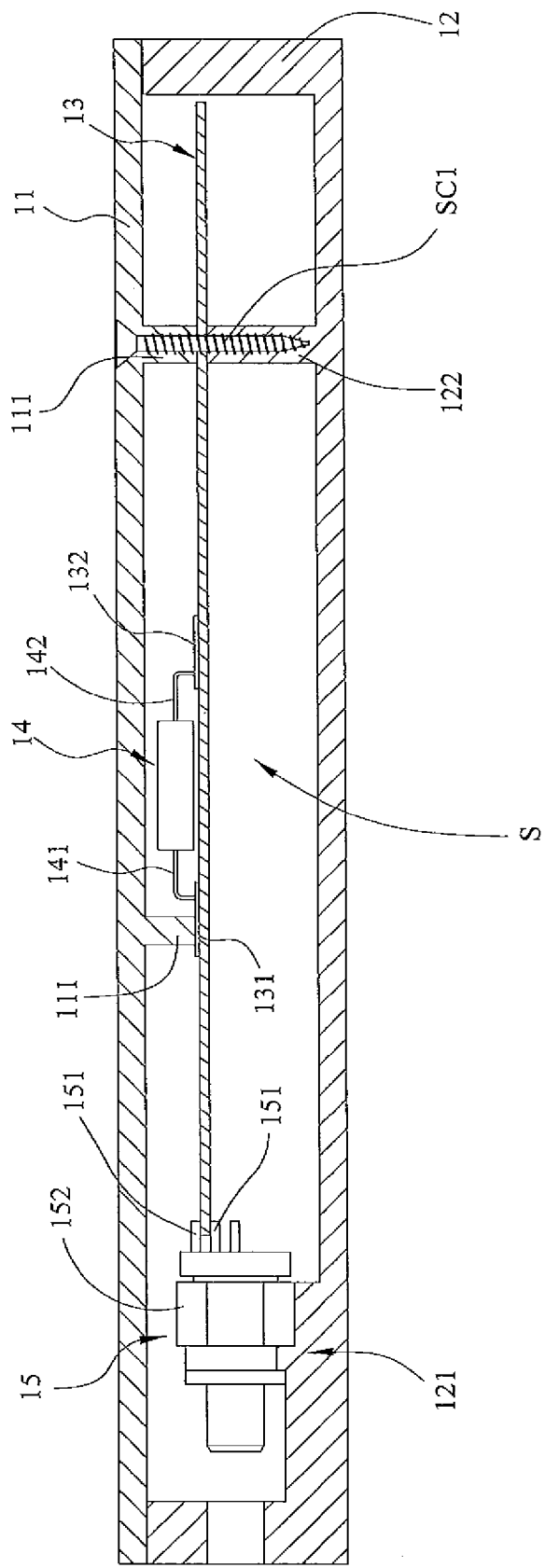
FIG. 1 is a schematic view of an optical communication device according to a first embodiment of the invention.

As shown in FIG. 1, an optical communication device 1 according to a first embodiment of the invention includes a top cover 11, a bottom cover 12, a circuit board 13 and an optical transceiver 15.

In this embodiment, the bottom cover 12 is disposed opposite to and connected to the top cover 11, and an accommodating space S is formed between the top cover 11 and the bottom cover 12. The top cover 11 has a first connecting portion 111 disposed on its inner wall and extending toward the accommodating space S. The bottom cover 12 has an accommodating recess 121 and a second connecting portion 122. The second connecting portion 122 is disposed on the inner wall of the bottom cover 12 and extending toward the accommodating space S. The material of the top cover 11 and the bottom cover 12 can be a conductive material such as a metal. The first connecting portion 111 is disposed opposite to the second connecting portion 122. The first connecting portion 111 and the second connecting portion 122 are connected by wedging, screwing or locking. For example, a screw SC1 is used to connect the first connecting portion 111 and the second connecting portion 122 in this embodiment. After they are connected, the top cover 11 and the bottom cover 12 are also tightly connected.

In this embodiment, the circuit board 13 is disposed in the accommodating space S formed between the top cover 11 and the bottom cover 12. Moreover, the circuit board 12 is disposed between the first connecting portion 111 and the second connecting portion 122. It should be mentioned that the circuit board 13 has an electrical connecting portion 131 and a ground portion 132. The electrical connecting portion 131 is, for example but not limited to, a connecting pad. The electrical connecting portion can be formed by a layout of printed wiring on the circuit board 13. The ground portion 132 provides the ground function for various electronic devices (not shown) disposed on the circuit board 13.

Referring to FIG. 1, the optical communication device 1 uses the optical transceiver 15 to transmit and receive optical data. The optical transceiver 15 can be, for example, a transmitter optical sub-assembly (TOSA) or a receiver optical sub-assembly (ROSA). In this embodiment, the optical transceiver 15 is disposed in the accommodating space S and fixed on the accommodating recess 121 of the bottom cover 12. The optical transceiver 15 has a housing 152 and several pins 151. The housing 152 is made of an insulating material. The optical transceiver 15 is electrically connected to the circuit board 13 by the pins 151.

It should be emphasized that in order for the optical communication device 1 to have the electrostatic discharge function, the optical communication device 1 has an electrostatic discharge element 14 disposed on the circuit board 13 and electrically connected to the top cover 11 via the electrical connecting portion 131 of the circuit board 13. The electrostatic discharge element 14 is an electrostatic discharge diode (ESD diode), for example. The electrostatic discharge element 14 has a first terminal 141 and a second terminal 142. The first terminal 141 is electrically connected to the electrical connecting portion 131 of the circuit board 13. The second terminal 142 is electrically connected to the ground portion 132 of the circuit board 13. The first connecting portion 111 of the top cover 11 is electrically connected to the electrical connecting portion 131 of the circuit board 13. Therefore, when electrostatic charges exist on the top cover 11, they can be conducted by the electrostatic discharge element 14 to the ground portion 132 of the circuit board 13. Consequently, the optical communication device 1 can be prevented from possible electrostatic damages.

In a preferred embodiment, the electrostatic discharge element has a first terminal directly electrically connected to the cover body and a second terminal electrically connected to the ground portion of the circuit board.

In summary, the optical communication device 1 in this embodiment has an electrostatic discharge element 14 electrically connecting the ground portion 132 of the circuit board 13 and the top cover 11, thereby forming an electrostatic discharge path therebetween. When the top cover 11 has electrostatic charges, the electrostatic discharge element 14 conducts them to the ground portion 132 of the circuit board 13. This prevents the electrostatic charges from directly discharging via the optical transceiver or other electronic devices of the optical communication device and causing damages. Therefore, the optical communication device 1 has higher reliability.

Second Embodiment

Figure 2:
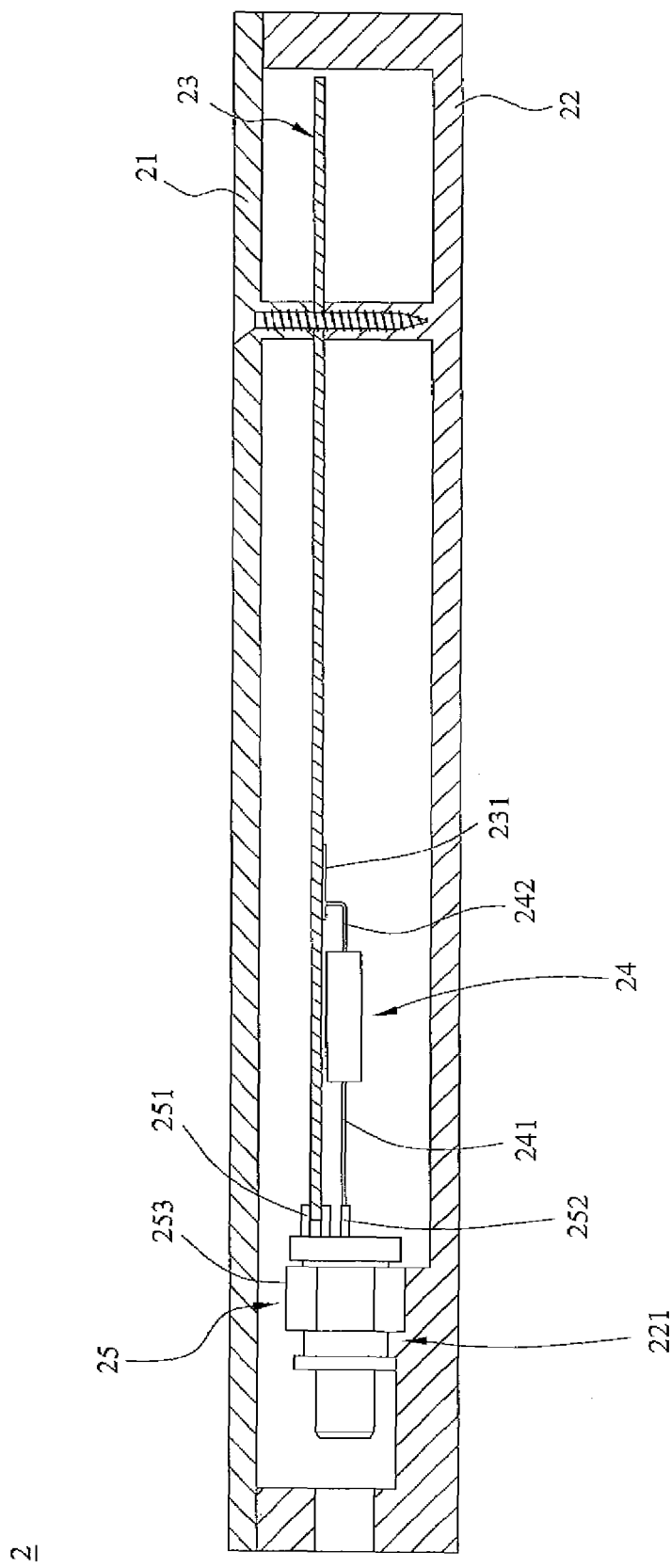
FIG. 2 is a schematic view of an optical communication device according to a second embodiment of the invention.
Figure 3:
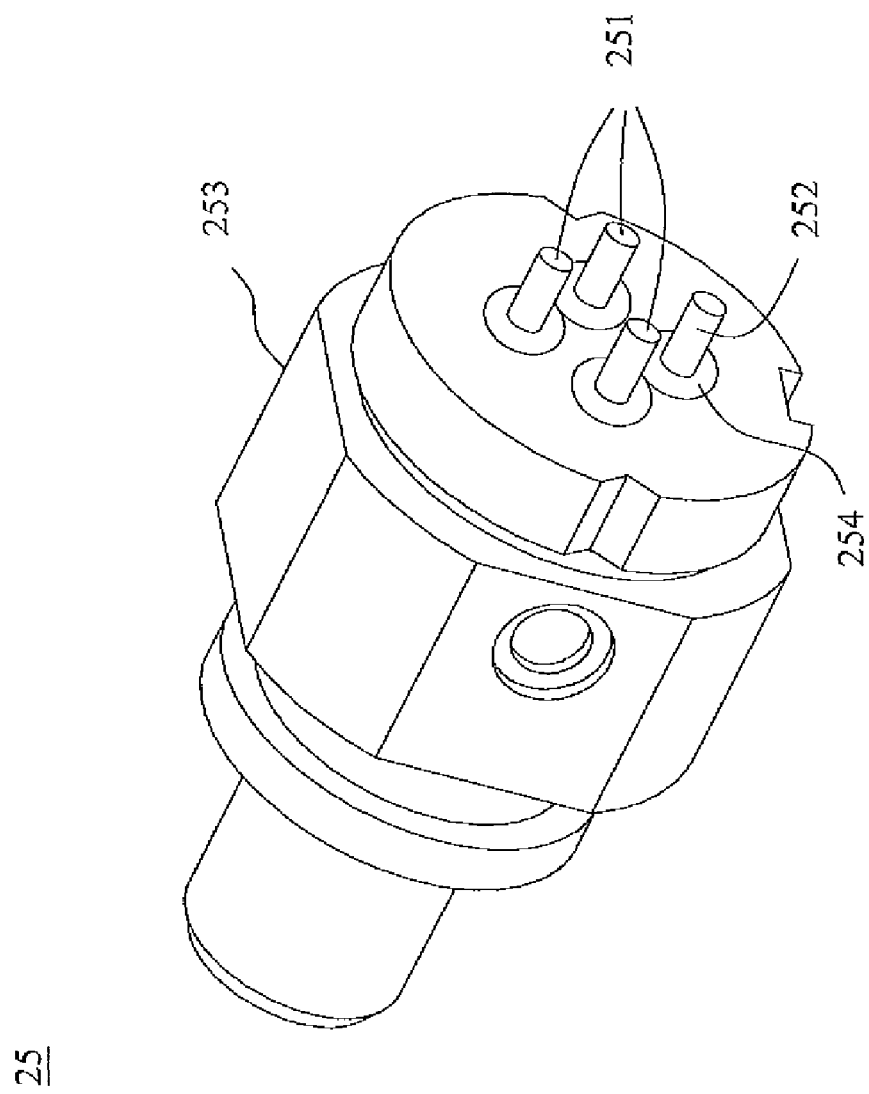
FIG. 3 schematically shows the structure of the optical transceiver in FIG. 2.

FIG. 2 is a schematic view of an optical communication device according to a second embodiment of the invention, and FIG. 3 schematically shows the structure of the optical transceiver in FIG. 2. Referring to FIG. 2, an optical communication device 2 according to the second embodiment has a top cover 21, a bottom cover 22, a circuit board 23, an electrostatic discharge element 24 and an optical transceiver 25. The optical transceiver 25 is disposed on an accommodating recess 221 formed in the bottom cover 22 and in touch with the bottom cover 22. The optical transceiver 25 has several first pins 251, a second pin 252 and a housing 253. The first pins 251 are electrically connected to the circuit board 23. The second pin 252 is electrically connected to the housing 253. The housing 253 is made of, for example, a conductive material. The material of the top cover 21 and the bottom cover 22 is a conductive material such as a metal. In addition, the optical transceiver 25 has several insulating layers 254 surrounding the first pins 251 and the second pin 252, as shown in FIG. 3.

The differences between the second embodiment and the first embodiment are as follows. The electrostatic discharge element 24 in the second embodiment has a first terminal 241 and a second terminal 242. The electrostatic discharge element 24 is disposed on and electrically connected to the circuit board 23. The first terminal 241 of the electrostatic discharge element 24 is electrically connected to the second pin 252 of the optical transceiver, and the second terminal 242 is electrically connected to the ground portion 231 of the circuit board 23. The optical communication device 2 in this embodiment has an electrostatic discharge path formed from the bottom cover 22, through the optical transceiver 25 and the electrostatic discharge element 24 to the circuit board 23. Since the optical transceiver 25 is in touch with the bottom cover 22 and its housing is conductive, the electrostatic charges on the bottom cover 22 can be conducted via the second pin 252 of the optical transceiver 25 and the electrostatic discharge element 24 to the ground portion 231 on the circuit board. This prevents the electrostatic charges from discharging via the internal circuit of the optical transceiver 25 or various electronic devices on the circuit board 23 that results in damages to the optical communication device 2.

In summary, the optical communication device of the invention has the following advantages:

The electrical connection of using the electrostatic discharge element between the circuit board and the top cover of the optical communication device forms an electrostatic discharge path through the top cover, the electrostatic discharge element and the circuit board.

The electrical connection of using the electrostatic discharge element between the optical transceiver and the circuit board enables the optical transceiver to be in electrical contact with the bottom cover of the optical communication device. Therefore, the bottom cover, the optical transceiver, the electrostatic discharge element and the circuit board can also form an electrostatic discharge path.

In comparison with the related art, the invention can form an electrostatic discharge path by electrically connecting the electrostatic discharge element with the top cover or the optical transceiver according to the different requirements in the structure of the optical communication device or the optical transceiver. The electrostatic discharge element conducts the electrostatic charges to the circuit board, preventing them from directly discharging via the internal circuit or other electronic device of the optical communication device and its optical transceiver. This avoids damages to the optical communication device. The electrostatic discharge element enhances the electrostatic protection ability of the disclosed optical communication device and thus increases the reliability thereof.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An optical communication device comprising:
   an optical transceiver;
   a cover body having an accommodating space;
   a circuit board disposed in the accommodating space; and
   an electrostatic discharge element disposed on the circuit board and having a first terminal and a second terminal, wherein the first terminal is electrically connected to the optical transceiver or an electrical connecting portion of the circuit board, and the second terminal is electrically connected to a ground portion of the circuit board.

2. The optical communication device of claim 1, wherein the cover body comprises a top cover and a bottom cover disposed opposite to each other so that the accommodating space is formed between the top cover and the bottom cover.

3. The optical communication device of claim 2, wherein the top cover has a first connecting portion disposed on an inner wall of the top cover and extending toward the accommodating space.

4. The optical communication device of claim 3, wherein the bottom cover has an accommodating recess and a second connecting portion disposed on an inner wall of the bottom cover and extending toward the accommodating space, and the first connecting portion and the second connecting portion are disposed opposite to each other.

5. The optical communication device of claim 3, wherein the electrical connecting portion is electrically connected to the first connecting portion of the top cover.

6. The optical communication device of claim 5, wherein the electrical connecting portion comprises a connecting pad or is formed by a layout of printed wiring on the circuit board.

7. The optical communication device of claim 1, wherein the electrostatic discharge element is an electrostatic discharge diode.

8. The optical communication device of claim 2, wherein the top cover and the bottom cover are connected by wedging, screwing or locking.

9. The optical communication device of claim 2, wherein a material of the top cover and the bottom cover is a conductive material or a metal.

10. The optical communication device of claim 4, wherein the optical transceiver is disposed on the accommodating recess and electrically connected to the circuit board.

11. The optical communication device of claim 10, wherein the optical transceiver has a plurality of first pins electrically connected to the circuit board.

12. The optical communication device of claim 10, wherein the optical transceiver comprises a plurality of first pins electrically connected to the circuit board and a second pin electrically connected to one terminal of the electrostatic discharge element.

13. The optical communication device of claim 12, wherein the second pin is electrically connected to a housing of the optical transceiver.

14. The optical communication device of claim 12, wherein the optical transceiver further comprises a plurality of insulating layers surrounding the first pins and the second pin.

15. The optical communication device of claim 10, wherein the optical transceiver comprises a housing made of a conductive material or an insulating material.

16. The optical communication device of claim 10, wherein the optical transceiver comprises a transmitter optical sub-assembly or a receiver optical sub-assembly.

17. The optical communication device of claim 4, wherein the circuit board is disposed in the accommodating space and is located between the first connecting portion and the second connecting portion.

18. The optical communication device of claim 17, wherein the first connecting portion and the second connection portion are connected by a screw.

* * * * *